United States Patent [19]

O'Berry et al.

[11] 3,999,136
[45] Dec. 21, 1976

[54] PULSE REPETITION FREQUENCY DETECTOR

[75] Inventors: William A. O'Berry; Carl D. Wise, both of Severna Park; Milton R. Lang, Jr., Baltimore, all of Md.

[73] Assignee: Westinghouse Electric Corporation, Pittsburgh, Pa.

[22] Filed: Apr. 2, 1969

[21] Appl. No.: 812,634

[52] U.S. Cl. .............................. 328/138; 328/140; 328/48
[51] Int. Cl.² ......................................... H03K 9/06
[58] Field of Search .................. 328/138, 140, 48; 307/233

[56] References Cited
UNITED STATES PATENTS
3,413,449   11/1968   Brown ........................ 328/140 X Primary Examiner—John S. Heyman
Attorney, Agent, or Firm—F. H. Henson

[57] ABSTRACT

A circuit for detecting the occurrence of incoming pulses at a predetermined repetition rate while remaining unresponsive to pulses occurring at an even harmonic of such rate, the circuit including a clock pulse generator and resettable counter arranged to count the pulses produced by the generator and to produce an output representing its current count, resetting means for resetting the counter to its "0" count state when an incoming pulse arrives at a time after the arrival of a preceding pulse which started the clock pulse generator which is equal to or greater than the time between pulses occurring at the repetition frequency to be detected, signal producing means for producing an output signal only when the time of arrival between such incoming pulses is equal to the time between pulses at the repetition frequency to be detected, and output signal suppressing means arranged to prevent the production of an output signal when an incoming pulse arrives at a time after the arrival of an incoming pulse which started the clock pulse generator equal to one-half the time between incoming pulses occurring at the repetition frequency to be detected. The clock pulse generator has a preferably variable repetition frequency which is a multiple of the repetition frequency to be detected.

9 Claims, 1 Drawing Figure

U.S. Patent      Dec. 21, 1976      3,999,136
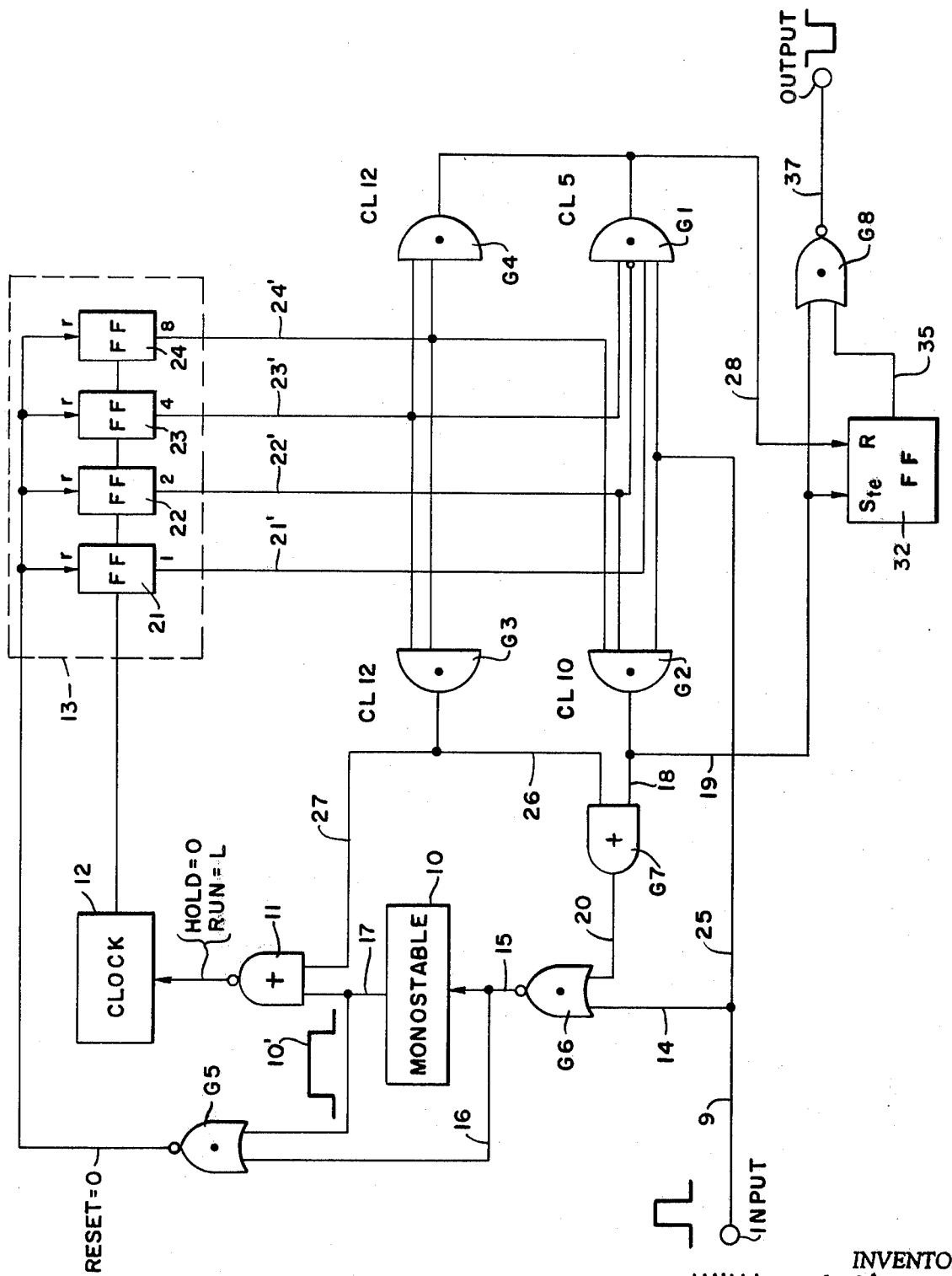
INVENTORS
William A. O'Berry
Carl D. Wise &
Milton R. Lang, Jr.
Ernest P. Klipfel
ATTORNEY

PULSE REPETITION FREQUENCY DETECTOR

SUMMARY OF THE INVENTION

The present invention relates to a pulse repetition frequency detector, and particularly to a detector which can be readily constructed in the form of an integrated circuit.

The invention is particularly intended for use in the field of electronics Countermeasures, when it is often necessary to detect a coherent pulse train having a given repetition frequency in an environment containing a multiplicity of trains of pulses having differing repetition frequencies.

Many circuits for effecting such a pulse train identification are already known. Recently proposed circuits of this type employ trains of monostable multivibrations which are triggered in sequence by an incoming pulse and which are arranged to compare the time of arrival of a subsequent pulse with a fixed time interval after the arrival of the first pulse to determine whether the succeeding pulses are occurring at the frequency to be identified. While such circuits perform their intended function reasonably well, they are expensive to fabricate. Moreover, their accuracy is limited primarily because monostable multivibrators do not operate in a highly stable manner and the plurality of monostable multivibrators employed in such circuits can produce a cumulative inaccuracy in the frequency measuring operation.

Moreover, many of the frequency detectors which have been thus far proposed are unable to distinguish between a pulse train at the frequency to be detected and a pulse train having a frequency which is an even harmonic of the frequency to be detected.

DISCLOSURE OF THE INVENTION

It is a primary object of the present invention to eliminate or substantially reduce the above drawbacks and difficulties.

Another object of the invention is to provide a pulse repetition frequency detector having a high accuracy and high stability.

A further object of the invention is to produce a detector at a lower cost than that of known detectors.

Still another object of the invention is to provide a detector circuit which does not employ a number of monostable multivibrators.

Still another object of the invention is to provide a detector that is unresponsive to pulse frequencies which are even harmonics of the frequency to be detected.

A still further object of the invention is to provide a detector circuit which can be constructed substantially entirely in the form of a single integrated circuit unit.

Still a further object of the invention is to provide a circuit which can be easily adjusted to detect different pulse repetition frequencies.

These and other objects according to the invention are achieved by the provision of a novel pulse repetition frequency detector which produces an indication in response to incoming pulses occurring at a predetermined repetition rate and which is insensitive to the occurrence of incoming pulses at rates equal to even harmonics of such predetermined rate. The detector according to the invention essentially includes input means for receiving pulses whose repetition rate is to be examined, clock means for producing clock pulses at a clock rate which is $n$ times the predetermined repetition rate to be detected, counter means connected to the clock means for counting such clock pulses and having a capacity to count more than $n$ pulses, and control means having a signal input connected to the input means, a gating input, and an output connected to the clock means and the counter means. The control means are arranged for resetting the counter means to its 0 count state and then starting the production of clock pulses by the clock means only when a pulse appears at its signal input in time coincidence with the presence of a gating signal at its gating input. The circuit further includes first gate signal producing means and second gate signal producing means, each having an output connected to the control means gating input, and output indicator means connected to the gate signal producing means for producing an output indication when three pulses occurring at the predetermined repetition rate have been received by the input means during an interval when pulses occurring at a synchronized even harmonic of such rate are not received. The first gate signal producing means has input connected to the input means and the counter means is arranged for producing a first gating signal at its output only when a pulse is received by the input means in time coincidence with the production of a count of $n$ by the counter means. The second gate signal producing means has an input connected to the counter means and is arranged to produce a second gating signal at its output only when the counter means reaches a predetermined count greater than $n$ and to maintain such gating signal as long as this count is present. The second gate signal producing means output is also connected to the clock means for stopping the production of clock pulses by the clock means whenever a second gating signal is present, thereby causing the counter means to store such predetermined count.

In accordance with a preferred embodiment of the present invention, the output indicator means include temporary storage means having a setting input connected to the first gate signal means output, and an output, resetting means connected between the storage means resetting input and both the counter means and the input means, and output signal generating means connected to the first gate signal producing means output and the temporary storage means output. The temporary storage means is arranged to apply a stored signal to its output in response to the occurrence of a first gating signal and the storage means also has a resetting input for receiving a resetting signal which acts to erase such stored signal. The resetting means is arranged for applying a resetting signal to the storage means resetting input whenever a pulse is received by the input means in time coincidence with the production of a count by the counting means which is substantially midway beween its 0 count and a count of $n$ and whenever the counter means reaches the predetermined count greater than $n$. The output signal generating means is arranged for producing an output indication whenever a first gating signal is produced while a stored signal is present at the storage means output.

BRIEF DESCRIPTION OF THE DRAWING

The single drawing FIGURE is a logic circuit diagram of a preferred embodiment of the invention.

DESCRIPTION OF THE PREFERRED EMBODIMENTS

The drawing FIGURE shows, in logic form, a complete pulse rate frequency detector circuit according to the invention. A cursory glance at this circuit diagram will readily reveal that the circuit includes but a single monostable multivibrator, the element 10, and the operation of the multivibrator does not have any influence on the frequency stability of the circuit. This represents one substantial advantage of circuits according to the invention since, as is well-known, gate circuits and bistable flip-flops, which constitute the frequency-determining circuit logic elements, are more stable in operation and less expensive to produce than are monostable multivibrators, particularly when the circuit is to be fabricated in integrated form as is contemplated for the circuit according to the present invention.

In the descriptin to be presented below, a positive signal, or binary one, will be identified as an "L", while a negative signal, or binary zero, will be identified as a 0.

The circuit according to the invention is intended to detect the presence of a given PRF (pulse repetition frequency) and to be insensitive to pulses whose frequency is an even harmonic of the frequency to be detected.

The circuit includes an input terminal for delivering received pulses to an input line 9. The input terminal is connected to a suitble unit, for example composed of a receiver and amplifier circuit, so as to have applied thereto the pulses to be monitored, it being desired that these pulses be delivered to the input terminal with a positive polarity. An AND gate G6 having a negative output has one input connected to input conductor 9 via a conductor 14. The negated output of gate G6 is connected to the input of a monostable multivibrator 1 via a conductor 15 and also to one input of a counter reset AND gate G5 via a conductor 16. Monostable multivibrator 10 is constructed to produce a positive pulse, representing an L, when a 0 is applied to its input via conductor 15. An OR unit 11 having a negated output has one input connected to the output conductor 17 of multivibrator 10. The output of unit 11 is connected to a HOLD conductor connected to control the running of a clock 12. Clock 12 is preferably constituted by a commercially available free-running multivibrator and, in the case of the embodiment illustrated, in constructed or set to have a clock pulse frequency equal to ten times the PRF which is to be detected.

The output conductor 17 of multivibrator 10 is also connected to the other input of gate G5, this gate having a negated output. A counter 13 is provided and, as shown is preferably in the form of a four-stage binary counter composed of four flip-flops 21, 22, 23 and 24, as well as the usual associated circuit components which are not shown for purposes of simplicity. Each flip-flop has a count output and each of the first three flip-flops 21, 22 and 23 also has a carry output connected to the signal input of the next succeeding flip-flop. The signal input of flip-flop 21 is connected to the output of clock 12, while the reset inputs of the four flip-flops are connected to the negated output of gate G5. The flip-flops 21 to 24 are arranged to be reset in response to the appearance of a 0 at their reset inputs. Counter 13 operates in a manner well-known per se to count the clock pulses produced by clock 12 and to produce, at its output lines 21', 22', 23', a binary indication of the count which has been reached. Thus, for example, after one clock pulse has been counted, an L will appear on line 21', while a 0 will appear on lines 22', 23'and 24'. Similarly, ater two clock pulses, an L will appear only on line 22', while an L will appear only one line 23' after four clock pulses have been counted and an L will appear only on line 24' after eight clock pulses have been counted. For the purpose of the present invention, the clock pulse counts which are of greatest importance are those corresponding to five, 10 and 12 clock pulses. When five clock pulses have occurred, an L will appear only on lines 23' and 21', while after the occurrence of 10 clock pulses, an L will appear only on line 22' and 24', and after the occurrence of 12 clock pulses an L will appear only on lines 23' and 24'.

The pulse sensing circuitry of the invention is centered around four multiple-input AND gates G1, G2, G3 and G4. Gate G1 has two direct inputs connected to lines 21' and 23', respectively, one further direct input connected to input conductor 9 via a line 25 and a negated input connected to line 22'. Gate G1 is intended to become enabled for responding to the appearance of a pulse on line 25 only during the interval when a count of "5" is being produced by counter 13, this corresponding to the appearance of an L only on lines 21' and 23'. Since an L also appears also on these two lines during the counting interval corresponding to a count of "7", when an L also appears on line 22', line 22' is connected to a negated input of gate G1 in order to assure that the gate will not become enabled when the counter 13 is producing a count of 7.

Gate G2 has three direct inputs connected, respectively, to lines 22', 24' and 25 and will become operative when the output of counter 13 corresponds to a count of "10". Each of gates G3 and G4 has two direct inputs connected, respectively, to lines 23' and 24', each of these gates being arranged to produce an L when a count of "12" has been reached.

The output of gate G3 is connected, via a conductor 26, to one input of an OR gate G7 and, via a conductor 27 to the other input of OR gate 11. The output of gate G2 is connected, via a conductor 18, to the other input of gate G7 and, via a conductor 19 to one input of an AND gate G8 and to the setting input, $S_{te}$, of a bistable flip-flop 32.

The output of gate G7 is connected to the other input of gate G6.

The output of gates G4 and G1 are connected, via a conductor 28, to the reset input, R, of flip-flop 32. The output of flip-flop 32 is connected, via a conductor 35, to the other input of AND gate G8. Flip-flop 32 is arranged to cause an L to appear on conductor 35 in response to the appearance of the trailing edge of an L at its trailing edge setting input $S_{te}$, and to cause a 0 to appear on line 35 when an L is applied to its reset input R. Since flip-flop 32 is of the bistable type, it will remain in its existing output state until a new L signal has been applied to one of its inputs.

Gate G8 has a negated output which is connected, via a conductor 37, to the circuit output terminal, an L signal normally appearing at the output terminal and a 0 pulse appearing thereat only when a pulse train having the frequency to be detected is applied to the circuit input terminal.

The operation of the illustrated circuit will now be described with reference to the state of the circuit at the start of operation and after counter 13 has reached counts of 10, 5, and 12.

START OF OPERATION

The operation of the device is initiated simply by turning the circuit on, i.e. supplying the various elements with operating power. When the circuit is first turned on, the counter 13 might be at any arbitrary count between 0 and 12, depending on the count which is contained when the circuit was last turned off. The counter might be at 0 if it is of a type whose count is automatically erased when the unit is turned off. However, as will be seen, the count stored in counter 13 at the start of operation is of no importance because the counter will automatically proceed to a count of 12 and store that count until a pulse is received at the input terminal.

Assuming that, after turn-on, any arbitary count other than 12 is stored in counter 13, and that no pulse appears at the circuit input terminal for a short period after turn-on, a 0 will be present on at least one of lines 23' and 24' so that a 0 will be present on gate output lines 27 and 26, and a 0 will also be present on line 17 since multivibrator 10 can be triggered to produce an L-pulse 10' only in response to the appearance of a pulse at the circuit input terminal. Since both inputs to OR gate 11 are in their 0 state, the negated output from gate 11 will present an L signal and this will place clock 12 in its running condition and thus cause counter 13 to begin to count up starting from the count stored therein at the start of operation.

Counter 13 will count up until reaching a count of 12, at which time an L appears on both lines 23' and 24'. When this occurs, an L will appear on both lines 27 and 26. The L signal on line 27 will cause a 0 to appear at the negated output of gate 11, stopping clock 12. This will stop counter 13 at its count of 12. The L on line 26 will produce an L on gate G7 output line 20, thus placing AND gate G6 in a condition to respond to an input pulse appearing at the circuit input terminal and conducted to this gate via conductors 9 and 14. The circuit will remain in this condition until an input pulse is received.

Of course, if counter 13 already has a count of 12 stored therein at the start of operation, the output signal on line 27 will automatically prevent clock 12 from running and the circuit will immediately be in the ready state described above.

In order to assure that the circuit can arrive at this ready state before an input pulse is received, and particularly to assure that, while the counter is initially reaching a count of 12 in order to place the circuit in its ready condition, the circuit does not respond to an input pulse appearing at the instance when the counter is at a count of 10, it is preferable that the delivery of pulses to the circuit input terminal be delayed for a short time after the circuit has been turned on, a time delay corresponding to slightly more than the period between pulses at the frequency to be detected being sufficient. However, such a delay is not essential since the chances of a pulse appearing at that instance are very slight and the appearance of such a pulse can produce only a single incorrect output indication which will not be repeated during the further operation of the device.

When the counter is at an count of 12 a L is also applied to line 28 by gate G4 and serves to reset flip-flop 32.

COUNT OF 10

The circuit is not in a condition to receive input pulses. When such a pulse appears at the circuit input terminal, it will be applied in the form of an L signal via line 14 to one input of AND gate G6. Since the other input of this gate is already receiving an L signal via line 20, the negated output of gate G6 will apply a 0 signal pulse to output line 15, the duration of this pulse being substantially equal to the duration of the pulse appearing at the circuit input. This 0 pulse triggers multivibrator 10 so as to cause it so produce an L output pulse 10', to 0 output pulse on line 15 also being applied, via line 16, to one input of counter reset AND gate G5. The other input of this gate is connected to the output line 17 of multivibrator 10. Multivibrator 10 is arranged to produce an output pulse 10' whose duration is longer than that of the pulses applied to the circuit input but shorter than the period between the pulses produced by clock 12.

Thus, the leading edge of a pulse applied to the circuit input causes a 0 to be applied to one input of gate G5 via line 16 and almost immediately thereafter causes an L signal, constituted by pulse 10', to be applied to the other input of gate G5. The appearance of a 0 signal on line 16 immediately before the appearance of an L signal on line 17 assures that the output state of reset gate G5 will not change immediately upon the appearance of an input pulse. However, upon the termination of the input pulse, which occurs before the termination of pulse 10', the output from gate G6, and hence the signal on line 16, will revert to an L, thus placing an L on both inputs of gate G5. This causes the negated output of this gate to produce a 0 which resets counter 13 to a count of 0.

This resetting of the counter 13 to 0 causes a 0 to appear on output line 27 of gate G3. However, a since the output pulse from monostable multivibrator 10 has placed an L signal on line 17 before the counter was reset, a 0 signal will continue to be applied to clock 12 so that the clock will not yet start running. The clock does start running upon the termination of output pulse 10', the length of this pulse being sufficient to assure that the clock will not start running until after counter 13 has had a chance to reset.

The clock then runs until ten clock pulses have been produced, the time required for the production of 10 clock pulses corresponding to the period between input pulses having the desired pulse repetition frequency.

During the clock pulse interval when a count of 10 appears at the output of counter 13, the two counter inputs 22' and 24' to gate G2 will present L signals. Therefore, if the circuit should receive an input pulse during this interval, such pulse would apply an L signal to the third input of gate G2, causing an L signal to appear on lines 18 and 19. The L signal on line 18 causes an L signal to appear on line 20 and since the pulse is also causing an L signal to appear on line 14, the output of gate G6 will be switched to present a 0 which acts in the manner described above, the reset counter 13 and temporarily hole clock 12. However, since the output of gate G3 continues to be a 0, clock 12 will once again start running, and counter 13 counting, upon the termination of multivibrator output pulse 10'.

The L signal produced by gate G2 in response to the appearance of an input pulse during the time when counter 13 is producing an count of 10 also causes a L signal to be delivered to the setting input $S_{te}$ of flip-flop 32. This flip-flop is constructed so that an L signal will appear at its output 35 upon the appearance of the trailing edge of an L pulse applied to its setting input. This assures that the first L pulse appearing on line 19 will cause L signals to appear simultaneously at both inputs of AND gate G8. Thus, the occurrence of two successive input pulses at the pulse repetition frequency to be detected causes an L signal to be stored on output line 35 of flip-flop 32. In addition, as has been noted above, that input pulse which causes this output to appear at flip-flop 32 also resets counter 13. Upon the termination of the output pulse 10' which was triggered by the occurrence of this last input pulse, clock 12 once again begins running and counter 13 begins counting over again.

If another input pulse then appears when the counter 13 has again reached a count of 10, indicating that input pulses are arriving at the desired pulse repetition frequency, the circuit will go through the same operation as that described above with reference to the previously-appearing input pulse. However, this time, because a L signal is already present on line 35, the appearance of an L signal on line 19 will cause the negated output of gate G8 to apply a 0 pulse to output line 37, the duration of which pulse is substantially equal to the duration of the circuit input pulse. There will thus appear at the circuit output terminal a negative pulse indicating that three successive pulses at the desired pulse repetition frequency have occurred.

If input pulses continue to appear at the desired rate, corresponding pulses will continue to produce at the circuit output terminal since an L signal will continue to be present on output line 35 of flip-flop 32.

COUNT OF 5

As has been mentioned earlier, the circuit according to the invention also acts to detect the presence of pulses whose repetition rate is an even harmonic of the rate which is to be detected. This function is essentially performed by gate G1 which is enabled to apply an L signal to line 28 if an input pulse should be applied to the circuit during the interval when counter 13 is producing a count of 5. For this purpose gate G1 has direct inputs connected to counter lines 21' and 23'. Gate G1 also has a negated input connected to line 22' of counter 13 to assure that the gate will not be enabled during the interval when a count of 7 is being produced by counter 13.

The occurrence at the circuit input terminal of pulses at twice the pulse repetition frequency which is to be detected corresponds to an interval between pulses equal to the time required for clock 12 to produce five clock pulses. Moreover, if pulses at a frequency which is any higher even harmonic of the repetition frequency to be detected should appear at the circuit input terminal, each such pulse will also have a time relationship to another such pulse which is equal to five clock pulse periods. For example, if pulses are being received at a rate equal to four times the repetition rate to be detected, every alternate incoming signal pulse will appear at an interval of five clock pulses.

If the system has been set into operation by an incoming pulse, and a subsequent incoming pulse should appear at an interval of five clock pulses after the occurrence of the pulse which had set the system into operation, i.e. when counter 13 is producing a count of 5, this last incoming pulse will cause an L signal to appear on line 28 and will thus reset flip-flop 32 so as to maintain, or restore, the output of flip-flop 32 to its 0 condition. However, such an incoming pulse will not stop the clock or reset the counter 13 so that the circuit will continue running.

If, then, a subsequent input pulse should occur at an interval of 10 clock pulses after the occurrence of the pulse which had set the circuit into operation, i.e. when the counter is producing an output of 10, this pulse will cause an L signal to appear on line 19 and will thus once again set flip-flop 32 so that an L signal appears on its output 35. If, then, a further pulse does not appear at an interval of five clock pulses after the last incoming pulse, and a pulse does appear at an interval of ten clock pulses after the last incoming pulse, a 0 pulse will appear at the circuit output terminal to provide an indication of the presence of a pulse train having the desired repetition frequency. Thus, the occurrence of a single spurious incoming pulse at an interval five clock pulses after a preceding pulse will not completely reset the circuit but will only delay the production of an output by the circuit until two successive pulses have occurred at the desired repetition frequency.

COUNT OF 12

If, at the time when counter 13 has counted 10 clock pulses after the occurrence of an incoming pulse which initiates the counting operation, a subsequent incoming pulse does not appear, indicating that pulses at the repetition frequency to be detected are not being received, counter 13 will continue its count until reaching a count of 12. When this count is reached, gate G4 will apply an L signal to line 28 to reset flip-flip 32 and gate G3 will apply an L signal to line 26 and 27 to stop clock 12 and cause counter 13 to store its count of 12 in the manner described above under Start of Operation. The circuit will then begin operating once again upon receipt of the next incoming pulse.

All of the elements of the circuit illustrated in the Figure can be constituted by well-known devices. In addition, all of these elements can, with the possible exception of clock 12, be fabricated in a well-known manner as a single integrated circuit. The clock itself can be constituted by a commercially available free running multivibrator. Even an inexpensive device of this type has been found to have excellent time and temperature stability. In accordance with a preferred embodiment of the invention, the clock 12 can be readily adjusted, or several interchangeable clocks can be provided, to vary the pulse repetition frequency which is to be described. This is highly advantageous because it permits a single integrated circuit device to be readily adapted for detecting a wide range of pulse repetition frequencies.

In the laboratory tests, it has been found that a working circuit having the form shown in the Figure could operate satisfactorily over a temperature range of −55° to +100° C while experiencing a frequency identification error of only 1.25 percent. In addition, the circuit was able to withstand a supply voltage fluctuation of 16.7 percent while experiencing an accompanying detection frequency error of only 1.2 percent. These results were obtained on a breadboard model and it should reasonably be expected that better results would be realized by a properly designed integrated circuit.

One of the substantial advantages afforded by the circuit according to the invention is that it will not be deceived by jittered pulses, primarily because the system is reset after each incoming pulse which provides an output indication. Therefore, the time between incoming pulses need only fall within certain limits in order to be identified and the tolerances imposed on the PRF detection can be designed to allow a reasonable amount of jitter.

In addition, because the counter is reset after each identified pulse, or after a maximum of twelve clock pulses, the clock pulse rate need not have a high long range accuracy.

It will be understood that the above description of the present invention is susceptible to various modifications, changes and adaptations.

What is claimed is:

1. A pulse repetition frequency detector which produces an indication in response to incoming pulses occurring at a predetermined repetition rate and which is insensitive to the occurrence of incoming pulses at rates equal to even harmonics of such predetermined rate, said detector comprising:
    a. input means for receiving pulses whose repetition rate is to be examined;
    b. clock means for producing clock pulses at a clock rate which is $n$ times the predetermined repetition rate to be detected;
    c. counter means connected to said clock means for counting such clock pulses and having a capacity to count more than $n$ pulses;
    d. control means having a signal input connected to said input means, a gating input, and outputs connected to said clock means and said counter means for resetting said counter means to its 0 count state and then starting the production of clock pulses by said clock means only when a pulse appears at its said input in time coincidence when the presence of a gating signal at its said gating input;
    e. first gate signal producing means having inputs connected to said input means and said counter means and an output connected to said control means gating input for producing a first gating signal at its said output only when a pulse is received by said input means in time coincidence with the production of a count of $n$ by said counter means;
    f. second gate signal producing means having an input connected to said counter means and an output connected to said control means gating input for producing a second gating signal at its said output only when said counter means reaches a predetermined count greater than $n$ and for maintaining such gating signal as long as such count is present, said second gate signal producing means output also being connected to said clock means for stopping the production of clock pulses by said clock means whenever such second gating signal is present, causing said counter means to store such predetermined count; and
    g. output indicator means connected to said, control means for producing an output indicator signal when three pulses occurring at the predetermined repetition rate have been received by said input means during an interval when pulses occurring at a synchronized even harmonic of such rate are not received.

2. An arrangement as defined in claim 1 wherein said output indicator means comprise:
    a. temporary storage means having a setting input connected to said first gate signal means output, and an output, arranged to apply a stored signal to its said output in response to the occurrence to a first gating signal, said storage means also having a resetting input for receiving a resetting signal which acts to erase such stored signal;
    b. resetting means connected between said storage means resetting input and both said counter means and said input means for applying a resetting signal to said storage means resetting input whenever a pulse is received by said input means in time coincidence with the production of a count by said counting means which is substantially midway between its 0 count and a count of $n$ and whenever said counter means reaches said predetermined count greater than $n$; and
    c. output signal generating means connected to said first gate signal producing means output and said temporary storage means output for producing an output indication whenever a first gating signal is produced while a storage signal is present at said storage means output.

3. An arrangement as defined in claim 1 wherein said clock means is constituted by a controllable free-running multivibrator whose clock rate is an even multiple of the predetermined repetition rate to be detected.

4. An arrangement as defined in claim 1 wherein said counter means is in the form of a multiple stage binary counter, with each stage being constituted by a JK flip-flop.

5. An arrangement as defined in claim 1 wherein said control means comprises:
    an AND gate having a first input connected to said input means and having a negated output;
    an OR gate having its output connected to a second input of said AND gate, a first input connected to said output of said first gate signal producing means, and a second input connected to said output of said second gate signal producing means;
    a monostable multivibrator having an input connected to the negated output of said AND gate and an output at which appears a pulse signal when the signal at the negated output of said AND gate corresponds to the presence of an input signal at both inputs of said AND gate, the duration of each such pulse produced at the output of said multivibrator being greater than the duration of an incoming pulse, the output of said multivibrator being connected to said clock means for stopping the production of clock pulses thereby during the occurrence of each multivibrator pulse;
    resetting means connected between the outputs of said AND gate and said monostable multivibrator and said counter means for producing a signal which resets said counter means only when an output pulse from said multivibrator is present in time coincidence with an output signal from said AND gate corresponding to the absence of a signal from at least one input of said AND gate.

6. An arrangement as defined in claim 1 wherein said first gate signal producing means comprises an AND gate having inputs connected to said counter means and said input means and an output connected to said control means.

7. An arrangement as defined in claim 1 wherein said second gate signal producing means comprises: a first AND gate having at least one input connected to said counter means and an output connected to both said clock means and said control means; and a second AND gate having at least one input connected to said counter means and output connected to said output indicator means.

8. An arrangement as defined in claim 1 further comprising even harmonic pulse rate suppressing means composed of an AND gate having at least one input connected to said counter means, an input connected to said input means, and an output connected to said output indicator means, said gate being arranged to produce a signal which prevents an indication from being produced by said output indicator means when an input pulse appears in time coincidence with the production of a count of $n/2$ by said counter means.

9. An arrangement as defined in claim 1 wherein said clock means comprises: a free-running multivibrator having a control input and arranged to produce clock pulses when a signal is present at said control input and to cease producing clock pulses for as long as no signal is present at said control input; and an OR gate having a negated output connected to said control input for normally applying a signal to said control input, said gate having a first input connected to said control means output and a second input connected to said second gate signal producing means output and arranged to not produce a control signal at its said output whenever said control means is activated or a second gating signal occurs.

* * * * *